US007521263B2

(12) United States Patent
Mizushima et al.

(10) Patent No.: US 7,521,263 B2
(45) Date of Patent: Apr. 21, 2009

(54) METHOD OF FORMING AN INSULATING FILM, METHOD OF MANUFACTURING A SEMICONDUCTOR DEVICE, AND SEMICONDUCTOR DEVICE

(75) Inventors: Ichiro Mizushima, Yokohama (JP); Masayuki Tanaka, Yokohama (JP); Katsuaki Natori, Yokohama (JP); Yoshio Ozawa, Yokohama (JP); Seiji Inumiya, Tsukuba (JP); Katsuyuki Sekine, Yokohama (JP); Tetsuya Kai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 380 days.

(21) Appl. No.: 11/270,536

(22) Filed: Nov. 10, 2005

(65) Prior Publication Data

US 2007/0020957 A1    Jan. 25, 2007

(30) Foreign Application Priority Data

Jun. 24, 2005    (JP)    ............................. 2005-185192

(51) Int. Cl.
*H01L 21/00* (2006.01)
(52) U.S. Cl. ...................... 438/3; 438/240; 438/261; 438/591; 257/E21.679
(58) Field of Classification Search ............... 438/3, 438/216, 240, 287, 591, 594, 261; 257/E21.625, 257/E21.639, E21.679, E21.686
See application file for complete search history.

(56) References Cited

U.S. PATENT DOCUMENTS 6,576,053 B1    6/2003    Kim et al.
2006/0094191 A1*    5/2006    Choi et al. .................. 438/261

FOREIGN PATENT DOCUMENTS

| JP | 5-251428 | 9/1993 |
|---|---|---|
| JP | 2001-152339 | 6/2001 |
| JP | 2001-338922 | 12/2001 |
| JP | 2003-124349 | 4/2003 |
| JP | 2004-214602 | 7/2004 |

OTHER PUBLICATIONS

Notification For Filing Opinion mailed Feb. 27, 2007 for Application No. 10-2006-56768 from the Korean Patent Office.

* cited by examiner

*Primary Examiner*—Thanhha Pham
(74) *Attorney, Agent, or Firm*—Finnegan, Henderson, Farabow, Garrett & Dunner, L.L.P.

(57) ABSTRACT

A method of forming an insulating film includes forming a base film comprising a material whose surface is oxidized by being exposed to an oxidant. A source gas containing a metal material and a first oxidant having a first oxidation force are alternately supplied to form a first insulating film on the base film. A source gas containing a metal material and a second oxidant having a second oxidation force stronger than the first oxidation force are alternately supplied to form a second insulating film on the first insulating film.

14 Claims, 3 Drawing Sheets

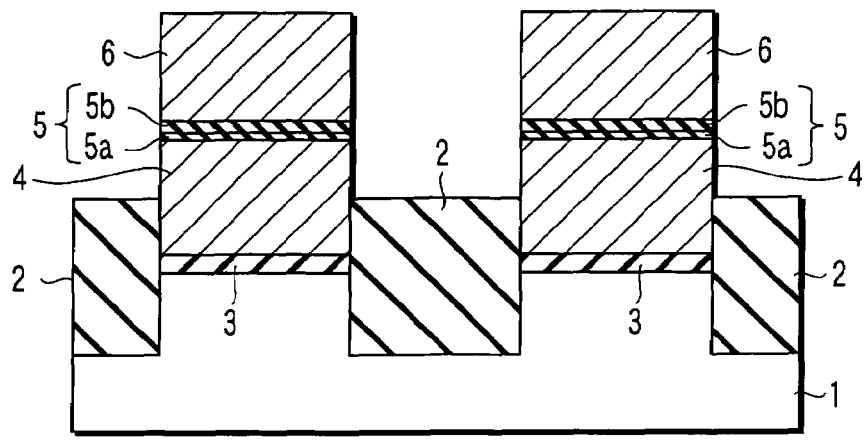
F I G. 1
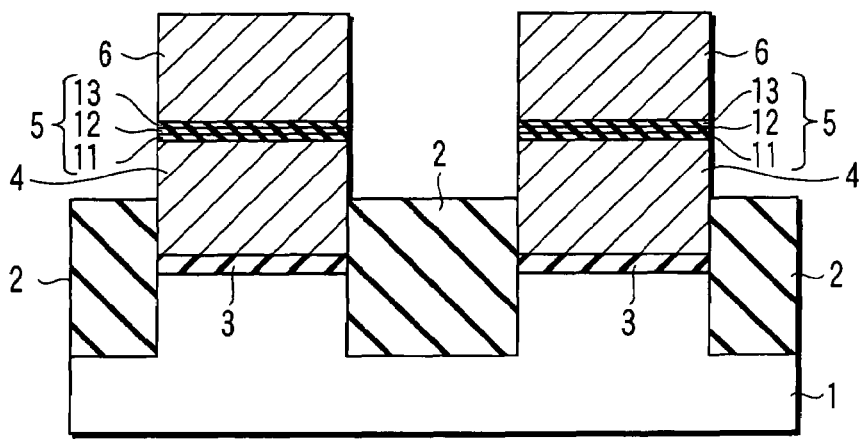
F I G. 2
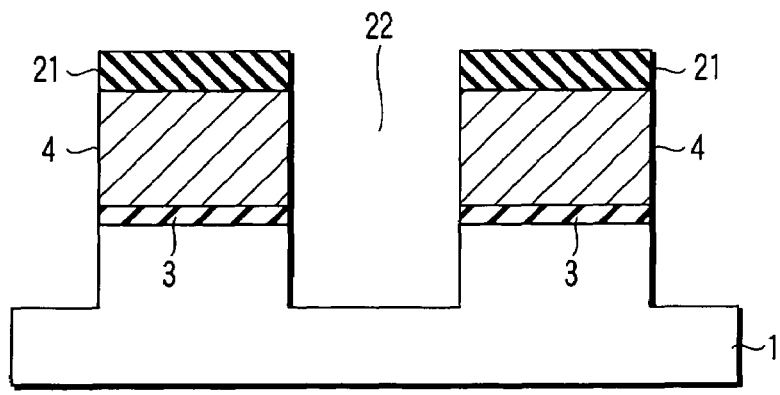
F I G. 3

METHOD OF FORMING AN INSULATING FILM, METHOD OF MANUFACTURING A SEMICONDUCTOR DEVICE, AND SEMICONDUCTOR DEVICE

CROSS-REFERENCE TO RELATED APPLICATIONS

This application is based upon and claims the benefit of priority from prior Japanese Patent Application No. 2005-185192, filed Jun. 24, 2005, the entire contents of which are incorporated herein by reference.

BACKGROUND OF THE INVENTION

1. Field of the Invention

The present invention relates to a method of forming an insulating film, a method of manufacturing a semiconductor device, and a semiconductor device. For example, the present invention relates to an intergate insulating film between floating and control gate electrodes.

2. Description of the Related Art

There has been a semiconductor device having a floating gate electrode, intergate insulating film and control gate electrode, which are successively stacked. In such a semiconductor device, the intergate insulating film is formed of a high-k dielectric film. The high-k dielectric film is used, and thereby, it is possible to suppress a leakage current between the floating and control gate electrodes. In this case, the less the concentration of C contained in the high-k dielectric film used as the intergate insulating film, the greater the leakage current is suppressed.

In the process of manufacturing the semiconductor device, formation of the film is carried out by the deposition using atomic layer deposition (ALD). ALD is a technique of successively depositing each layer at a unit of atomic layer to form a film having a desired thickness. The thickness of the film can be precisely controlled using ALD.

If the high-k dielectric film as the intergate insulating film is deposited using ALD, source gas containing metal element and source gas as oxidant are alternately supplied. Preferably, oxidant having strong oxidation force (strong oxidant) is used in order to suppress C concentration of the high-k dielectric film formed using ALD. JPN. PAT. APPLN. KOKAI Publication No. 2001-152339 and U.S. Pat. No. 6,576,053 disclose a technique of using $O_3$ as the strong oxidant.

BRIEF SUMMARY OF THE INVENTION

According to a first aspect of the present invention, there is provided a method of forming an insulating film, comprising: forming a base film comprising a material whose surface is oxidized by being exposed to an oxidant; alternately supplying a source gas containing a metal material and a first oxidant having a first oxidation force to form a first insulating film on the base film; and alternately supplying a source gas containing a metal material and a second oxidant having a second oxidation force stronger than the first oxidation force to form a second insulating film on the first insulating film.

According to a second aspect of the present invention, there is provided a method of manufacturing a semiconductor device, comprising: forming a first insulating film on a semiconductor substrate; forming a first conductive film comprising a material whose surface is oxidized by being exposed to an oxidant; alternately supplying a source gas containing a metal material and a first oxidant having a first oxidation force to form a second insulating film on the first conductive film; alternately supplying a source gas containing a metal material and a second oxidant having a second oxidation force stronger than the first oxidation force to form a third insulating film on the second insulating film; and forming a second conductive film on the third insulating film.

According to a third aspect of the present invention, there is provided a semiconductor device comprising: a semiconductor substrate; a first insulating film formed on the semiconductor substrate; a first conductive film formed on the first insulating film and comprising a material whose surface is oxidized by being exposed to an oxidant; a second insulating film formed on the first conductive film and comprising a first part and a second part, the first part positioned on the first conductive film, the second part positioned on the first part, a carbon concentration in the first part being higher than a carbon concentration of the second part; and a second conductive film formed on the second insulating film.

BRIEF DESCRIPTION OF THE SEVERAL VIEWS OF THE DRAWING

FIG. 1 is a cross-sectional view schematically showing the structure of main parts of a semiconductor device according to one embodiment of the present invention;

FIG. 2 is a cross-sectional view schematically showing the structure of main parts of a semiconductor device according to another embodiment of the present invention;

FIG. 3 is a cross-sectional view showing part of process of manufacturing the semiconductor device according to one embodiment of the present invention;

DETAILED DESCRIPTION OF THE INVENTION

Figure 4:
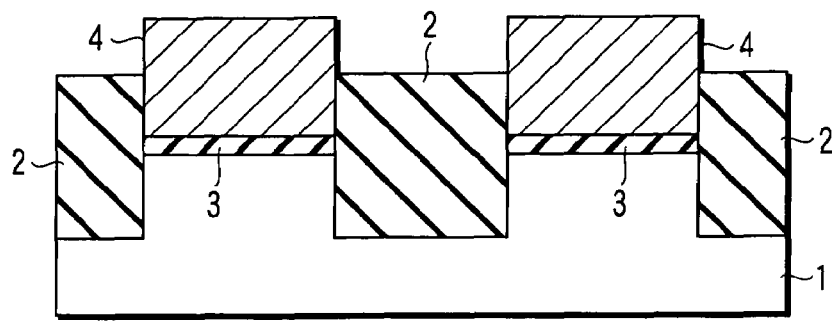
FIG. 4 is a cross-sectional view showing a state following FIG. 3.

The inventors have studied a technique to form a high-k dielectric film using the strong oxidant like the one mentioned in "Description of the Related Art" during the development of the invention. As a result, the inventors obtained the following knowledge.

As described above, the high-k dielectric film formed via ALD using the strong oxidant is employed as the intergate insulating film. By doing so, leakage current via the intergate insulating film is suppressed. However, the strong oxidant also strongly oxidizes the floating gate electrode. For this reason, if polysilicon is used as the floating gate electrode, the following problem arises. Specifically, if the intergate insulating film is formed using the method in fact, a silicon oxide film having a thickness of about 1 nm is formed between the floating gate electrode and the intergate insulating film. The silicon oxide film reduces an effective dielectric constant of the high-k dielectric film as the intergate insulating film. As a result, leakage current increases.

Embodiments of the present invention made based on the knowledge will be described below with reference to the accompanying drawings. In the following description, the same reference numerals are used to designate components having the same function and structure, and the overlapping explanation is made if necessary.

FIG. 1 is a cross-sectional view schematically showing the structure of main parts of a semiconductor device according to one embodiment of the present invention.

As shown in FIG. 1, the semiconductor device has semiconductor substrate 1, isolating insulation film 2, tunnel insulating film 3, floating gate electrode 4, intergate insulating film 5 and control gate electrode 6.

The semiconductor substrate 1 is formed of silicon, for example. The surface of the semiconductor substrate 1 is formed with an isolating insulation film 2 consisting of a silicon oxide film. The surface of the isolating insulation film 2 projects from the surface of the semiconductor substrate 1.

The tunnel insulating film 3 is formed on the surface of the semiconductor substrate 1 between the isolating insulation films 2. The tunnel insulating film 3 is formed of a silicon oxide film, for example. The floating gate electrode 4 is formed on the tunnel insulating film 3. The floating gate electrode 4 consists of polysilicon doped with P (phosphorus), for example. In other words, the floating gate electrode 4 consists of a material, which forms an oxide film on its surface when exposed to an oxidant.

The intergate insulating film 5 is formed on the floating gate electrode 4. The intergate insulating film 5 consists of high dielectric material; for example, $Al_2O_3$ or $HfO_2$. The intergate insulating film 5 comprises a first part 5a on the floating gate electrode 4, and a second part 5b on the first part 5a. The first part 5a and the second part 5b differ from each other in the method of forming these parts as described later.

The intergate insulating film 5 may be formed of several layers, which are successively stacked, as illustrated in FIG. 2. FIG. 2 is a cross-sectional view schematically showing the structure of main parts of a semiconductor device according to another embodiment. As seen from FIG. 2, the intergate insulating film 5 is formed of three layers, 11, 12 and 13. Layers 11, 12 and 13 consist of, for example, $HfO_2$, $Al_2O_3$ and $HfO_2$, respectively. Layers 11, 12 and 13 have thickness of, for example, 4 nm, 10 nm and 4 nm, respectively.

For example, $Ta_2O_5$, $ZrO_2$ and $Ta_2O_5$ may be used as the layers 11, 12 and 13, respectively. The mixture of $Ta_2O_5$ and $HfO_2$, may be used as layers 11 and 13 and the mixture of $Al_2O_3$ and $ZrO_2$ may be used as the layer 12. The gate insulating film 5 may have the stacked layer structure more than above.

If the intergate insulating film 5 is a stacked layer film, a portion on the floating gate electrode 4 is equivalent to the first part 5a while the remaining portion is equivalent to the second part 5b in the intergate insulating film 5. Specifically, the first part 5a and the second part 5b are distinguished from each other according to the forming method described later, and not material forming those parts. Therefore, the first part 5a and the second part 5b may be formed of the same material, and may be formed of a different material.

The control gate electrode 6 is formed on the intergate insulating film 5. The control gate electrode 6 consists of polysilicon doped with P.

Figure 5:
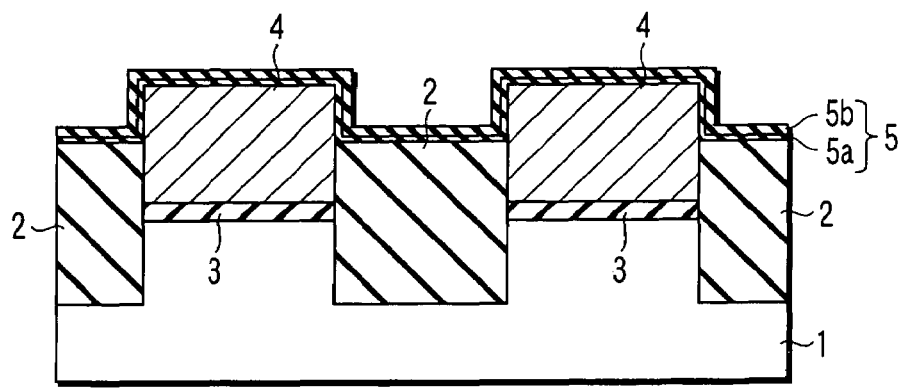
FIG. 5 is a cross-sectional view showing a state following FIG. 4.

The method of manufacturing the semiconductor device will be described below with reference to FIG. 3 to FIG. 5. FIG. 3 to FIG. 5 is a cross-sectional view showing one process of manufacturing the semiconductor device according to this embodiment.

As depicted in FIG. 3, the entire surface on the semiconductor substrate 1 is formed with the tunnel insulating film 3 via the thermal oxidization process. Then, the floating gate electrode 4 is deposited on the entire surface of the tunnel insulating film 3 via chemical vapor deposition (CVD).

A mask material 21 such as silicon nitride film is formed on the floating gate electrode 4 via CVD, lithography process and etching such as reactive ion etching (RIE). The mask material 21 has an opening at a region where the isolating insulation film 2 to be formed.

The floating gate electrode 4, tunnel insulating film 3 and the surface of the semiconductor substrate 1 are etched using the mask material 21 as a mask to form an opening 22.

As seen from FIG. 4, the opening 22 is filled with a material film (e.g., silicon oxide film) of the isolating insulation film 2 via CVD. Simultaneously, the entire surface of the mask material 21 is formed with the material film of the isolating insulation film 2. Extra material films on the mask material 21 is removed using chemical mechanical polishing (CMP) so that the upper surface of the film filled in the opening 22 is etched back to a position slightly higher than the semiconductor substrate 1. By doing so, the isolating insulation film 2 is formed. Thereafter, the mask material 21 is removed.

As shown in FIG. 5, the intergate insulating film 5 is deposited on the floating gate electrode 4 and the isolating insulation film 2 according to ALD. During this process, if source gas having strong oxidation force is used as oxidant as described above, a silicon oxide film is formed on the floating gate electrode 4. For this reason, in the initial stage of forming the intergate insulating film 5, gas having weaker oxidation force is used as the oxidant.

For example, $O_3$ having strong oxidation force is used as the oxidant, that is, source gas. However, a material having weaker oxidation force than $O_3$; for example, $H_2O$ is used in the initial stage of forming the intergate insulating film 5. NO or $O_2$ may be used. Moreover, if the oxidation force is different between two kinds of oxidants, various combinations may be employed. For example, $O_3$ having different concentration may be used.

When gas is supplied into a chamber, $H_2O$ is easy to adhere to the surface. Therefore, using $H_2O$ as source gas having weak oxidation force enables to shorten time taken to fully oxidize one layer on the surface. Specifically, according to alternate gas supply, if $H_2O$ is used, the supply time is three seconds. If $O_2$ or NO is used, the supply time is 20 seconds.

In the intergate insulating film 5, a portion formed using gas having weak oxidation force is equivalent to the first part 5a. The remaining portion formed using source gas having strong oxidation force is equivalent to the second part 5b.

In the process of forming the intergate insulating film 5 consisting $Al_2O_3$ and the $Al_2O_3$ layer 12 of FIG. 2, trimethyl aluminum (TMA) is used as a source gas for supplying metal material.

In the process of forming the intergate insulating film 5 consisting $HfO_2$ and the $HfO_2$ layers 11 and 13 of FIG. 2, terakisi diethylamino hafnium (TDEAH) is used as a source gas for supplying metal material. Or, terakisi ethylamino hafnium (TEMAH) may be used.

In the film forming initial stage, $H_2O$ having weak oxidation force is used as the oxidant, and thereby, the floating gate electrode 4 is prevented from being oxidized over a wide range. As a result, the thickness of the silicon oxide film (not shown) formed on the floating gate electrode 4 is reduced to about 0.4 nm. The method of forming the intergate insulating film 5 will be described later.

The intergate insulating film 5 is formed, and thereafter, the intergate insulating film 5 is crystallized via heat treatment at a temperature of 900° C. Then, the control gate electrode 6 is deposited via CVD.

As shown in FIG. 1, the floating gate electrode 4, intergate insulating film 5 and control gate electrode 6 are patterned via lithography process and etching such as RIE.

The method of forming the intergate insulating film 5 will be described with reference to FIG. 6 and FIG. 7 in detail. The semiconductor device was manufactured via the process. In the manufactured semiconductor device, the intergate insulating film 5 comprises a stacked layer film shown in FIG. 2, and $HfO_2$, $Al_2O_3$ and $HfO_2$ were used as layers 11, 12 and 13, respectively. Layers 11, 12 and 13 had thickness of 4 nm, 10 nm and 4 nm, respectively.

Figure 6:
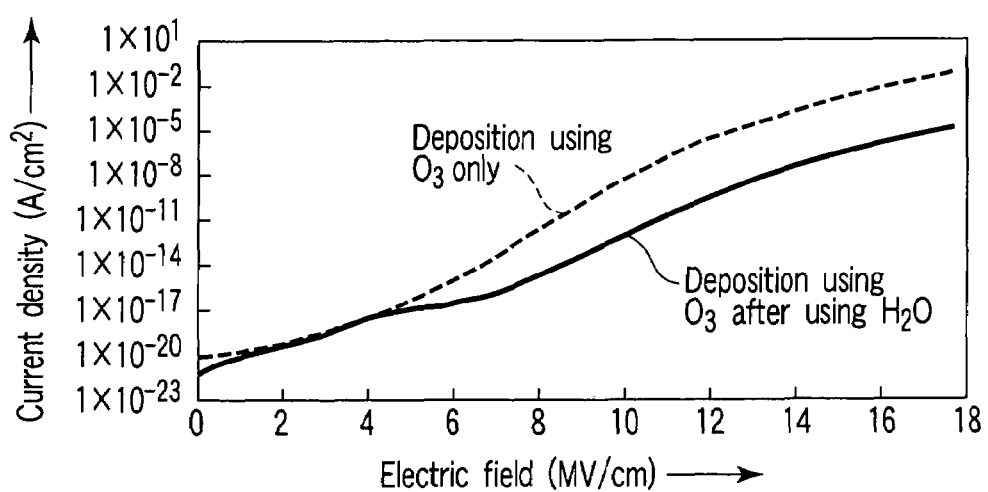
FIG. 6 is a graph to explain the relationship between current density of leakage current of an intergate insulating film and electric field applied thereto.

FIG. 6 is a graph to explain the relationship between current density of leakage current of an intergate insulating film 5 and electric field applied thereto in the manufactured semiconductor device. In FIG. 6, the solid line shows the case (this embodiment) where $H_2O$ and $O_3$ were used as an oxidant. On the other hand, the broken line shows the case where $O_3$ only was used as the oxidant.

As seen from FIG. 6, in the intergate insulating film of the embodiment, leakage current is suppressed as compared with the conventional intergate insulating film. This results from the reduction of the thickness of the silicon oxide film between floating gate electrode 4 and intergate insulating film 5 in the semiconductor device according to the embodiment.

Figure 7:
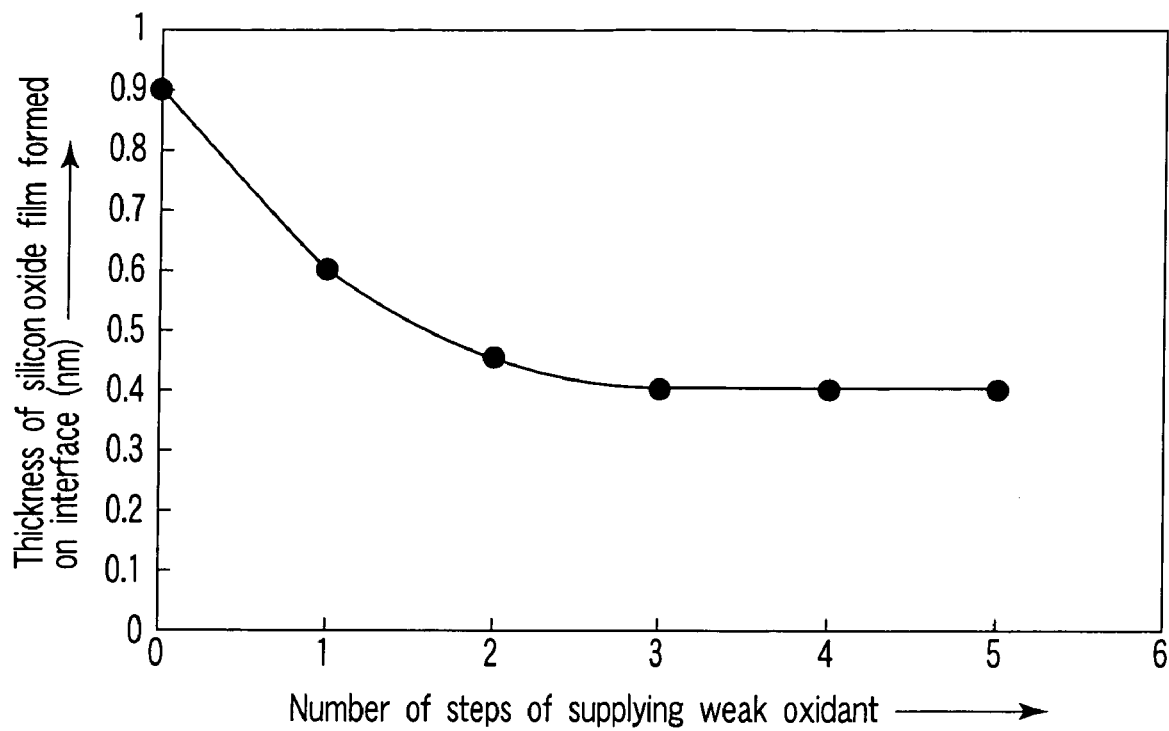
FIG. 7 is a graph to explain the relationship between the number of supply times of weak oxidant and thickness of a silicon oxide film formed on a floating gate electrode.

FIG. 7 is a graph to explain the relationship between the number of supply times of weak oxidant ($H_2O$) and thickness of a silicon oxide film formed on the floating gate electrode 4. As described before, according to ALD, metal supply source and oxidant are alternately supplied. Thus, the number of times of supplying the oxidant is the same meaning as the number of times (steps) of alternately supplying metal supply source and oxidant.

As seen from FIG. 7, if the weak oxidant is supplied one time, the thickness of the silicon oxide film largely reduces. In particular, when the number of supply times is two (two steps (equivalent to the case where oxidant, metal material and oxidant are successively supplied)), it can be seen that the thickness of the silicon oxide film reduces greatly.

The thickness formed according to one-time metal material supply ranges from about 0.08 nm to 0.1 nm. Therefore, the thickness of the first part 5a of the intergate insulating film 5 formed via two steps is less than 0.2 nm. In this case, the thickness of the silicon oxide film is about 0.4 nm.

If film is formed using the weak oxidant, the concentration of impurity (C or the like) contained in the film tends to increase. For this reason, it is recommended that the number of times of supplying the weak oxidant is small. As is evident from FIG. 7, the thickness of the silicon oxide film is not greatly reduced even if the weak oxidant is supplied more than tree times. Judging from this result, the number of times of supplying the weak oxidant is one or two, preferably two.

Heat treatment may be carried out in order to reduce the impurity concentration of the film due to the weak oxidant. The heat treatment is carried out at a temperature higher than the film forming temperature between the process of using weak oxidant and the process of using strong oxidant. This step can reduce leakage current in the first part 5a of the intergate insulating film 5.

As described above, the first part 5a and second part 5b of the intergate insulating film 5 are different from each other in the forming method. Thus, even if the first part 5a and second part 5b are formed using the same material, their characteristics are different. The following is an explanation about the characteristics difference.

The weak oxidant is used in the initial stage of forming the intergate insulating film 5. For this reason, the concentration of C contained in the film, that is, first part 5a is higher than the second part 5b. The concentration of C should be avoided in the light of forming an oxide high-k dielectric film having less impurity. However, in the interface with the floating gate electrode 4, it is desirable to contain different kind of material having concentration of C to some degree in the light of relaxing unmatching at the interface by the incorporation of C atoms at the interface.

Specifically, if $O_3$ only is used as the oxidant, $HfO_2$ as the intergate insulating film 5 formed on the floating gate electrode 4 averagely and uniformly contained C of $1\times10^{18}$ $cm^{-3}$. Moreover, the concentration of C was slightly reduced in the interface (equivalent to first part 5a in this invention) with the floating gate electrode 4.

Conversely, according to the embodiment, both first part 5a and second part 5b were formed using $HfO_2$, and the first part 5a of thickness of 1 nm was formed using the weak oxidant; for example, $H_2O$. In this case, the concentration of C in the first part 5a is $1\times10^{19}$ $cm^{-3}$, and is higher than the concentration of C ($1\times10^{18}$ $cm^{-3}$) in the second part 5b.

It is difficult to solely determine leakage current reduction effect by the first part 5a containing higher concentration of C. Because the silicon oxide film formed on the interface between the floating gate electrode 4 and intergate insulating film 5 formed thin, and thereby, leakage current is reduced. However, unmatching at the interface is relaxed because of the incorporation of C atoms which relax the strain at the interface. Therefore, the method of the embodiment is effective to form a high-k dielectric film having preferable film quality.

Figure 8:
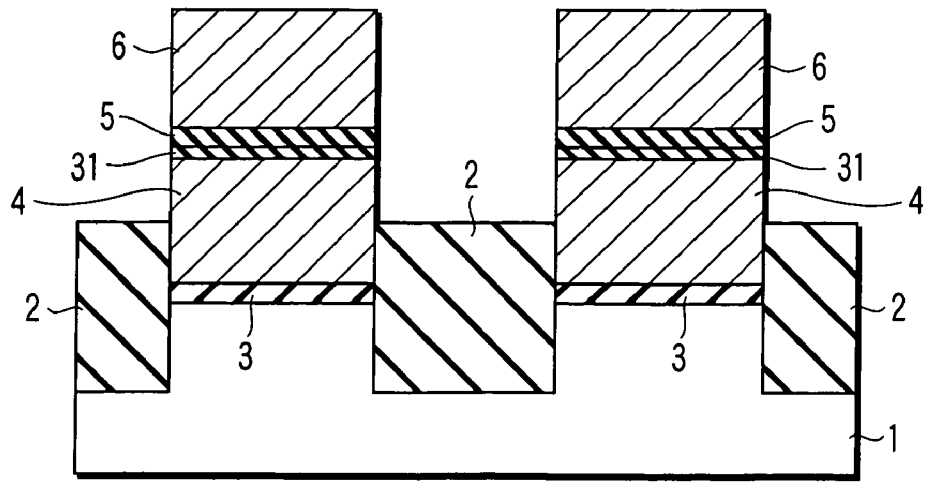
FIG. 8 is a cross-sectional view schematically showing the structure of main parts of a semiconductor device according to another embodiment of the present invention.

According to the embodiment, the intergate insulating film 5 is formed on the silicon oxide film as the floating gate electrode 4. As illustrated in FIG. 8, a thin insulating film 31 such as silicon nitride film may be formed on the floating gate electrode 4.

For example, the strong oxidant such as $O_3$ also oxidizes the silicon nitride film. For this reason, the surface of the silicon nitride film is formed with a silicon oxide film. Thus, if $O_3$ is used as the oxidant in the initial stage to form high-k dielectric film on the silicon nitride film, the following result is brought about. Namely, a silicon oxide film is further formed on the silicon nitride film having dielectric constant higher than the silicon oxide film. The silicon oxide and silicon nitride films reduce permittivity between the floating gate electrode 4 and control gate electrodes 6. Therefore, when the silicon nitride film is formed, it is also necessary to form the intergate insulating film 5 while suppressing oxidization on of its surface. In this case, the weak oxidant is used in the film forming initial stage, and thereby, the oxidation force of the silicon nitride film can be suppressed. Thus, even if the insulating film 31, which might be silicon nitride, is formed on the floating gate electrode 4, the embodiment is effective.

In the semiconductor device according to the embodiment of the present invention, source gas having weak oxidation force is used as the oxidant in the film forming initial stage of the intergate insulating film 5. On the other hand, source gas having strong oxidation force is used as the oxidant to form the remaining portion of the intergate insulating film 5. Consequently, it is possible to suppress the silicon oxide film from forming between the floating gate electrode 4 and the intergate insulating film 5, and to form the intergate insulating film 5 which allows small leakage current.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming an insulating film, comprising:
   forming a base film comprising a material whose surface is oxidized by being exposed to an oxidant;
   alternately supplying a source gas containing a metal material and a first oxidant having a first oxidation force to form a first insulating film on the base film;
   heating the first insulating film at a temperature higher than a processing temperature of forming the first insulating film between forming the first insulating film and forming a second insulating film;
   alternately supplying a source gas containing a metal material and a second oxidant having a second oxidation force stronger than the first oxidation force to form the second insulating film on the first insulating film; and
   forming a conductive film on the second insulating film.

2. The method according to claim 1, wherein the first oxidant is water or oxygen or nitrogen monoxide.

3. The method according to claim 1, wherein the second oxidant is ozone.

4. The method according to claim 1, wherein the first oxidant is supplied one time or two times.

5. The method according to claim 1, wherein the metal material contained in the source gas supplied when forming the first insulating film is the same as the metal material contained in the source gas supplied when forming the second insulating film.

6. The method according to claim 1, wherein the first oxidant is water or oxygen or nitrogen monoxide, the second oxidant is ozone, and the first oxidant is supplied one time or two times.

7. The method according to claim 6, wherein the metal material contained in the source gas supplied when forming the first insulating film is the same as the metal material contained in the source gas supplied when forming the second insulating film.

8. A method of manufacturing a semiconductor device, comprising:
   forming a first insulating film on a semiconductor substrate;
   forming a first conductive film comprising a material whose surface is oxidized by being exposed to an oxidant on the first insulating film;
   alternately supplying a source gas containing a metal material and a first oxidant having a first oxidation force to form a second insulating film on the first conductive film;
   heating the second insulating film at a temperature higher than a processing temperature of forming the second insulating film between forming the second insulating film and forming a third insulating film;
   alternately supplying a source gas containing a metal material and a second oxidant having a second oxidation force stronger than the first oxidation force to form the third insulating film on the second insulating film; and
   forming a second conductive film on the third insulating film.

9. The method according to claim 8, wherein the first oxidant is water or oxygen or nitrogen monoxide.

10. The method according to claim 8, wherein the second oxidant is ozone.

11. The method according to claim 8, wherein the first oxidant is supplied one time or two times.

12. The method according to claim 8, wherein the metal material contained in the source gas supplied when forming the second insulating film is the same as the metal material contained in the source gas supplied when forming the third insulating film.

13. The method according to claim 8, wherein the first oxidant is water or oxygen or nitrogen monoxide, the second oxidant is ozone, and the first oxidant is supplied one time or two times.

14. The method according to claim 13, wherein the metal material contained in the source gas supplied when forming the second insulating film is the same as the metal material contained in the source gas supplied when forming the third insulating film.

* * * * *